United States Patent [19]

Desilets et al.

[11] Patent Number: 4,600,464
[45] Date of Patent: Jul. 15, 1986

[54] PLASMA ETCHING REACTOR WITH REDUCED PLASMA POTENTIAL

[75] Inventors: Brian H. Desilets, Wappingers Falls; Thomas A. Gunther, Hopewell Junction; Charles J. Hendricks, Wappingers Falls; John H. Keller, Poughkeepsie, all of N.Y.

[73] Assignee: International Business Machines Corporation, Armonk, N.Y.

[21] Appl. No.: 729,445

[22] Filed: May 1, 1985

[51] Int. Cl.⁴ .................. B44C 1/22; C03C 15/00; C03C 25/06; C23F 1/02
[52] U.S. Cl. .................... 156/345; 156/643; 156/646; 204/298
[58] Field of Search ............ 156/345, 643, 646; 204/192 E, 298; 118/728, 50.1, 620

[56] References Cited

U.S. PATENT DOCUMENTS

| | | | |
|---|---|---|---|
| 4,297,162 | 10/1981 | Mundt et al. | 156/643 |
| 4,307,283 | 12/1981 | Zajac | 219/121 PG |
| 4,340,461 | 7/1982 | Hendricks et al. | 204/298 |
| 4,349,409 | 9/1982 | Shibayama et al. | 156/643 |
| 4,384,938 | 5/1983 | Desilets et al. | 204/298 |

Primary Examiner—William A. Powell
Attorney, Agent, or Firm—Douglas A. Lashmit

[57] ABSTRACT

An improved plasma reactor for uniformly etching a large number of semiconductor wafers at a reduced plasma potential includes, in one embodiment, a grounded plate mounted intermediate the cathode and the top plate of a reactor chamber, the top plate and the chamber walls forming the reactor anode. The grounded plate is spaced apart from the chamber top plate a distance sufficient to allow a plasma to be established between the grounded plate and the top plate, and the distance between the grounded plate and the cathode is large enough not to disturb the field in the proximity of the wafers being etched. The plate can be apertured to facilitate etchant gas flow. According to another embodiment of the invention at least two grounded plates are employed, spaced apart from each other and from the upper surface of the reactor plasma chamber.

11 Claims, 2 Drawing Figures

PLASMA ETCHING REACTOR WITH REDUCED PLASMA POTENTIAL

BACKGROUND OF THE INVENTION

The present invention relates generally to plasma etching reactors and more particularly to an improved plasma reactor for batch wafer processing as employed in the fabrication of integrated circuits.

Plasma or reactive ion etching (RIE) is widely used to etch a variety of thin film materials and has been shown to be compatible with commonly used photoresist systems. One of the advantages of RIE is that it is a highly directional etching technique which does not exhibit many of the shortcomings of prior processes such as ion milling and sputter etching.

The recent trend has been toward larger reactors which can process larger batches of semiconductor wafers, and thereby provide more economical integrated circuit manufacture. One problem encountered in scaling up RIE tools is maintaining a uniform etch rate from wafer to wafer in a batch. This problem has been addressed, with varying degrees of success, by prior art etching devices such as those described in U.S. Pat. No. 4,297,162 to Mundt et al., and U.S. Pat. No. 4,307,283 to Zajac. Another such device is described in U.S. Pat. No. 4,340,361 to Hendricks et al. and assigned to the assignee of the present invention. The Hendricks et al. plasma chamber includes a conductive apertured baffle plate affixed to the anode for adjusting the etchant species concentration across the target to provide a uniform concentration from wafer to wafer. This is accomplished by providing apertures in the baffle plate of various sizes, shapes and locations.

U.S. Pat. No. 4,349,409 to Shibayama et al. discloses a plasma reactor including an electrically isolated, apertured, intermediate electrode between the anode and the cathode of the plasma chamber. The distance between the intermediate electrode and the cathode, and the electrode bias voltage, are varied during the etching process in order to remove any previously damaged surface layer and any unwanted deposits from the wafers being etched.

An RF plasma reactor for batch processing is disclosed in U.S. Pat. No. 4,384,938 to Desilets et al., which is assigned to the assignee of the present invention. In this reactor the cathode to chamber sidewall spacing is less than the thickness of the system plasma sheath to improve etch rate uniformity while maximizing the number of wafers that can be processed in a single batch.

Another problem in scaling up a plasma reactor to a larger batch size is that the plasma potential is increased. This is particularly true in the case of reactors wherein the cathode size is maximized in order to increase the batch size, without increasing the overall diameter of the reactor. The increase in plasma potential is a result of the decrease in the area ratio of the plasma chamber, which is defined as the total surface area of the chamber at ground potential exposed to the plasma divided by the surface area of the electrode at high potential. For example, in a reactor such as the one described in the Desilets et al. patent, where the cathode size is maximized, a plasma potential as high as 160-170 volts has been observed.

The plasma potential, i.e., the potential difference between the plasma and the grounded reactor surfaces, is a measure of the amount of ionic bombardment to which these surfaces are subjected. If the plasma potential is greater than the sputtering threshold of the reactor wall material, then the wafers being processed will be subjected to contamination from the sputtered materials from the reactor surfaces. The increased plasma potential also has been observed to increase the chemical activity of the reactor surfaces, which causes the larger system to etch differently as compared to a scaled-down reactor and necessitates changes in the process parameters.

SUMMARY OF THE INVENTION

The present invention provides an improved plasma reactor for uniformly etching a large number of semiconductor wafers at a reduced plasma potential. According to one aspect of the invention a grounded plate is mounted intermediate the cathode and the top plate of a reactor chamber, the top plate and the chamber walls forming the reactor anode. The grounded plate is spaced apart from the chamber top plate a distance sufficient to allow a plasma to be established between the grounded plate and the top plate. The distance between the grounded plate and the cathode is large enough not to disturb the field in the proximity of the wafers being etched. The plate can be apertured to facilitate etchant gas flow.

According to another aspect of the invention at least two grounded plates are employed, spaced apart from each other and from the upper surface of the reactor plasma chamber.

It is therefore an object of the present invention to provide an improved batch type RIE plasma reactor.

Another object of the present invention is to provide an improved plasma reactor for uniformly etching a large number of semiconductor wafers.

Still another object of the present invention is to provide a plasma reactor for uniformly etching a large number of semiconductor wafers at a reduced plasma potential.

BRIEF DESCRIPTION OF THE DRAWINGS

Other objects and many of the attendant advantages of the present invention will be better understood by reference to the following detailed description in conjunction with the accompanying drawings, in which like reference numerals designate the same or similar parts throughout the several views, and wherein.

DETAILED DESCRIPTION OF THE PREFERRED EMBODIMENTS

Figure 1:
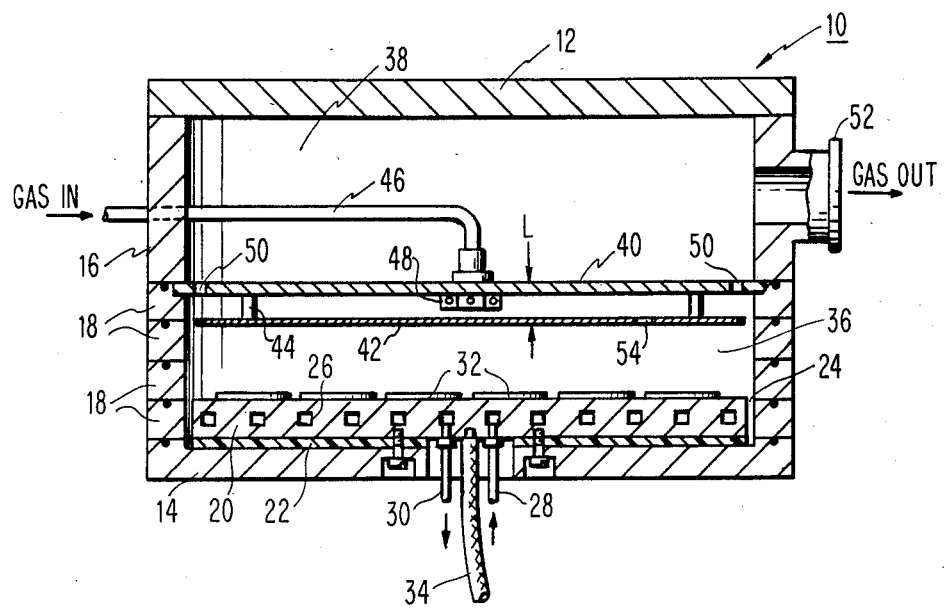
FIG. 1 is an elevational view in cross-section of a plasma reactor according to one embodiment of the present invention.

Referring now to the drawings, there is shown in FIG. 1 a plasma reactor 10 in accordance with the principles of the present invention. Reference is also made to U.S. Pat. No. 4,384,938 to Desilets et al., incorporated herein by reference, which discloses a typical batch type plasma reactor to which the present invention may be advantageously applied. In one embodiment the present reactor includes a cylindrical, symmetrical plasma chamber which functions as the anode. Reactor 10 is formed of a conductive (e.g., aluminum) top plate 12, a bottom plate 14, and a sidewall 16, the lower portion of which includes rings 18. Rings 18 provide a means for adjusting the chamber size as well as accessing the chamber for cleaning, maintenance and the like. A reactor cathode 20 spaced apart from sidewall rings 18 is separated from the chamber bottom plate 14 by an insulator 22. As explained in the Desilets et al. patent, the gap 24 between cathode 20 and rings 18 is preferably less than about 3.0 mm., assuming a dark space or reactor plasma sheath on the order of 1.25 cm., to assure that a plasma will not be sustained therein. Cathode 20 includes a plurality of cooling channels 26, a cooling fluid inlet port 28 and a cooling fluid outlet port 30 to aid in regulating the cathode temperature and thus the temperature of wafers 32 placed thereon. RF power is applied to cathode 20 by means of a connection 34.

Reactor 10 is divided into a lower active plasma chamber 36 and an upper gas manifold 38 by a conductive plate 40 which acts to confine the plasma to chamber 36. Plate 40 forms the top plate of plasma chamber 36 and, in conjunction with sidewall rings 18 and bottom plate 14, acts as the reactor anode which is grounded. Spaced apart from plate 40, within plasma chamber 36, is a solid conductive plate 42. Plate 42 is coupled to plate 40 by conductive spacers 44. The gap between the periphery of plate 42 and chamber sidewall rings 18 must be greater than the thickness of the system plasma sheath, and the diameter of plate 42 should be greater than the diameter formed by the pattern of wafers 32 on cathode 20. The distance between plate 42 and plasma chamber top plate 40, designated "L" in FIG. 1, must be large enough to allow a plasma to be established therebetween, yet not so large as to disturb the electric field in the proximity of wafers 32. In practice, L should be a distance of several "dark spaces", i.e., several times the thickness of the system plasma sheath. Also, plate 42 should be positioned at least several mean free paths (of the reactive ion species used in the etchant gas) above cathode 20.

The etchant gas is supplied to plasma chamber 36 via a gas inlet tube 46 connected to a nozzle 48 affixed to the underside of plate 40. The gas and any reaction products are pumped out of chamber 36 through pumpout holes in plate 40. Holes 50 should be less than about 1.5 mm. in diameter so as not to sustain an active plasma as explained above. The gas is removed from manifold 38 through port 52.

In some processes it may be advantageous to provide apertures 54 (one shown) in plate 42 to provide uniform etchant gas distribution to each of the wafers 32 on cathode 20. As explained above with respect to holes 50, the diameter of each aperture 54 should be less than about 1.5 mm. The aperture pattern can be tailored to meet the requirements of a particular process.

Various known etchant gas mixtures may be employed in the present plasma reactor to carry out conventional reactive ion etching. One common gas used for this purpose is $CF_4$ and $O_2$. Other typical gases are $CHF_3$, $SF_6$ and $CClF_3$.

The addition of grounded plate 42 to plasma chamber 36 has been found to be an effective means of reducing the plasma potential by substantially increasing the area ratio of the chamber and producing a plasma density in the region of plate 42 that is equal to or greater than the plasma density near cathode 20.

Figure 2:
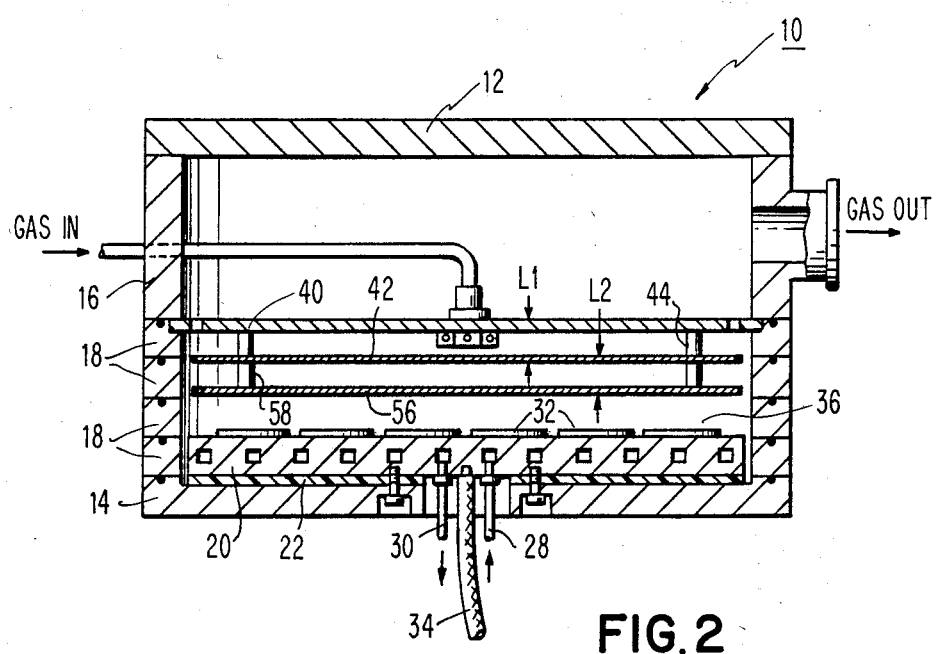
FIG. 2 is a cross-sectional view of the plasma reactor of FIG. 1 including multiple grounded plates.

Referring to FIG. 2, there is shown another embodiment of the present invention wherein multiple grounded plates are employed to further reduce the plasma potential. A second grounded plate 56 is spaced apart a distance L2 from plate 42 by conductive spacers 58. Distance L2 may be less than, equal to or greater than L1, however, L2 should be at least equal to the thickness of the system plasma sheath. Plate 56 should be positioned several plasma sheath thicknesses above the plasma sheath in the proximity of cathode 20. The diameter of plate 56 can be less than or equal to the diameter of plate 42, but plate 56 should be larger than the pattern of wafers 32 on cathode 20. Additional grounded plates may be used subject to the above described criteria.

By way of example, the plasma potential was measured in a plasma reactor as shown in FIG. 1, but without plate 42. Chamber 36 was approximately 23.25 in. in diameter and about 5.4 in. high. Using $CF_4$ gas at a pressure of 54 microns and a flow rate of 40 SCCM, and an RF power of 775 watts, the measured plasma potential was 200 volts. With a solid aluminum plate 42 having a diameter of about 23 in. and a spacing (L) of about 0.5 in. installed in chamber 36, the measured plasma potential under similar process conditions was 58 volts. The etch uniformity from wafer to wafer was about 10% with plate 42 as compared to about 7% without the plate. The addition of a second solid plate 56 with a diameter of about 21.0 in. and a spacing (L2) of 0.5 in., with plate 42 being apertured, resulted in a plasma potential of about 59 volts and an improved etch uniformity of about 7%. The use of two or more solid plates would yield a lower plasma potential with les etch uniformity.

There has thus been provided by the present invention an improved plasma reactor for RIE processing a large batch of wafers at a reduced plasma potential as compared to prior reactors, resulting in a substantial reduction in wafer contamination due to the sputtering of chamber wall material.

While the invention has been particularly shown and described with reference to the preferred embodiments thereof, it will be understood by those skilled in the art that various changes in form and details may be made therein without departing from the spirit and scope of the invention.

What is claimed is:

1. In a plasma reactor having a planar cathode and a plasma chamber acting as an anode, wherein an RF signal applied between said cathode and said anode acts to produce a plasma therebetween, the improvement comprising:
   a grounded plate spaced apart from the upper surface of said chamber a predetermined distance, said distance being large enough to allow a plasma to be established between said upper chamber surface and said grounded plate, but not so large as to disturb the field in the proximity of said cathode.

2. The plasma reactor of claim 1 wherein the distance between said grounded plate and said chamber sidewalls is at least slightly greater than the thickness of the plasma sheath of said reactor.

3. The plasma reactor of claim 2 wherein said grounded plate includes a plurality of apertures therethrough.

4. The plasma reactor of claim 2, further including at least a second grounded plate spaced apart from said first grounded plate said predetermined distance.

5. In a plasma reactor having a planar cathode and a plasma chamber acting as an anode, wherein an RF signal applied between said cathode and said anode acts to produce a plasma therebetween, the improvement comprising:

at least one grounded plate spaced apart from the upper surface of said chamber a predetermined distance, said distance being large enough to allow a plasma to be established between said upper chamber surface and said grounded plate, but not so large as to disturb the field in the proximity of said cathode, each successive grounded plate being spaced apart from the preceding grounded plate a second predetermined distance.

6. The plasma reactor of claim 5 wherein at least one of said grounded plates includes a plurality of apertures therethrough.

7. The plasma reactor of claim 6 wherein the distance between at least one of said grounded plates and said chamber sidewalls is at least slightly greater than the thickness of the plasma sheath of said reactor.

8. The plasma reactor of claim 7 comprising at least two of said grounded plates of substantially the same diameter.

9. The plasma reactor of claim 7 comprising at least two of said grounded plates wherein one of said grounded plates has a smaller diameter than the other.

10. The plasma reactor of claim 8 wherein said first grounded plate is substantially equally spaced between said plasma chamber upper surface and a second grounded plate.

11. The plasma reactor of claim 9 wherein said first grounded plate is substantially equally spaced between said plasma chamber upper surface and a second grounded plate.

* * * * *